United States Patent [19]
Brady et al.

[11] Patent Number: 5,134,460
[45] Date of Patent: Jul. 28, 1992

[54] ALUMINUM BUMP, REWORKABLE BUMP, AND TITANIUM NITRIDE STRUCTURE FOR TAB BONDING

[75] Inventors: Michael J. Brady, Brewster; Sung K. Kang, Millwood; Paul A. Moskowitz, Yorktown Heights, all of N.Y.; James G. Ryan, Essex Junction, Vt.; Timothy C. Reiley, Ridgefield, Conn.; Erick G. Walton, Johnson, Vt.; Harry R. Bickford, Ossining; Michael J. Palmer, Walden, both of N.Y.

[73] Assignee: International Business Machines Corporation, Armonk, N.Y.

[21] Appl. No.: 609,057

[22] Filed: Nov. 2, 1990

Related U.S. Application Data

[63] Continuation of Ser. No. 203,568, May 27, 1988, abandoned, which is a continuation of Ser. No. 895,090, Aug. 11, 1986, abandoned.

[51] Int. Cl.$^5$ ............... H01L 23/48; H01L 29/46; H01L 29/62
[52] U.S. Cl. ............... 357/71; 357/67; 357/69
[58] Field of Search ............... 357/67, 69, 71, 65, 357/68, 70

[56] References Cited

U.S. PATENT DOCUMENTS

| | | |
|---|---|---|
| 3,531,852 | 10/1970 | Slemmons et al. |
| 3,821,785 | 6/1974 | Rose ............... 357/67 |
| 3,886,585 | 5/1975 | Konantz et al. ............... 357/67 |
| 4,000,842 | 1/1977 | Burns ............... 357/71 X |
| 4,263,606 | 4/1981 | Yorikane ............... 357/71 |
| 4,551,912 | 11/1985 | Marks et al. ............... 437/19 |
| 4,600,600 | 7/1986 | Pammer et al. ............... 357/67 |
| 4,609,936 | 9/1986 | Scharr et al. ............... 357/71 X |

FOREIGN PATENT DOCUMENTS

| | | | |
|---|---|---|---|
| 52-23281 | 2/1977 | Japan ............... | 357/69 |
| 53-33057 | 3/1978 | Japan ............... | 357/71 |

OTHER PUBLICATIONS

Liu, Tien-Shih et al., "Metallurgical Considerations in Tin-Gold Inner Lead Bonding Technology", Int. J. for Hybrid Microelectronics, vol. (12), 1978, pp. 69–76.
Lassus, Marc, "Semiconductors with Bump Contacts . . .", Microelectronique, Jan. 12, 1976, pp. 23–25.
Castrucci et al., IBM Tech. Discl. Bulletin, vol. 9, No. 12, May 1967, p. 1805.
Gniewek et al., IBM Tech. Discl. Bulletin, vol. 13, No. 5, Oct. 1970, p. 1124.
Wittmer, Appl. Physics Lett. 37(6), Sep. 15, 1980, pp. 540–542.
Electronique & Microelectronique, No. 229, Dec. 1, 1976, pp. 23–25, M. Lassus: "Les semi-conducteurs; a protuberances".

Primary Examiner—Andrew J. James
Assistant Examiner—Sara W. Crane
Attorney, Agent, or Firm—Daniel P. Morris

[57] ABSTRACT

A semiconductor chip carrying integrated circuits has lead lines terminating in conductive terminal pads exposed to the exterior through openings in a passivation layer. The pads include pedestals or bumps extending up from them. Each of the pedestals includes a thin metallic adhesion layer deposited on the pad. A thick metallic layer of aluminum or an alloy of aluminum is deposited upon said thin metallic adhesion layer. The thick metallic layer includes at least one metal selected from the group consisting of aluminum, aluminum plus a small percentage of Cu, Ni, Si, or Fe. Several other alternative metals can be added to aluminum to form an alloy. The thick metallic layer forms the bulk of the height of the pedestal. An adhesion layer is deposited on the bump of aluminum composed of a thin film of titanium or chromium. A barrier layer is deposited on the adhesion layer composed of copper, nickel, platinum, palladium or cobalt. A noble metal consisting of gold, palladium, or platinum is deposited on the barrier layer. In a variation of the top surface, a thick cap of a reworkable bonding metal is deposited above the metallic bump as the top surface of said bump. The bump can be composed of a number of metals such as gold, copper, nickel and aluminum in this case with aluminum being preferred. In place of the adhesion and barrier metals one can employ a layer of titanium nitride deposited on said thick layer of metal.

15 Claims, 3 Drawing Sheets

ALUMINUM BUMP, REWORKABLE BUMP, AND TITANIUM NITRIDE STRUCTURE FOR TAB BONDING

This is a continuation of application Ser. No. 07/203,568, filed May 27, 1988 abandoned which was a continuation of application Ser. No. 06/895,090, filed Aug. 11, 1986, abandoned.

BACKGROUND OF THE INVENTION

1. Field of the Invention

The present invention relates to packaging for large scale integrated electronic circuits, and more particularly to terminals on chips in the form of bumps adapted to bonding of a lead to connect the chip in an electronic system.

2. Description of Related Art

Low cost packaging of electronic chips requires that chips be manufactured in large quantities at low cost. Tape Automated Bonding (TAB) is a way of reducing labor costs in bonding chips to packages. Most commonly, TAB packaging involves the provision of a 10-25 μm tall metallic bump, usually composed of gold on a bare aluminum I/O pad on the surface of the chip. The bump has served as a bonding platform extending very high above the top surface of the chip thereby providing a pedestal above the surrounding insulation and allowing connections to the underlying metallurgy. The tall bump also protects the pad below from corrosion by covering it and isolating it from the environment.

In general the gold bumps or their equivalent have been applied to the chips by means of electroplating or similar wet chemical additive processes of deposition of metal onto the chip. These wet chemical processes require the immersion of the entire chip wafer into the electroplating bath, exposing the wafer to all of the chemicals in the bath. The removal of the common plating electrode (necessary for the plating operation) must be further accomplished by another wet chemical etching step, ion-beam etching or the equivalent.

Virtually all of the papers and patents on semiconductor attachment techniques use aluminum in making ohmic contact to the semiconductor but have not used aluminum in the bulk material of solid bumps. Aluminum is commonly used as a thin film wiring level material. An early article, Noubel et al "Metallurgy Including a Chromium Slice", *IBM Technical Disclosure Bulletin* p 769 Dec. 1968) uses aluminum as an ohmic contact as a matter of course. Connections to the semiconductor chip are made by a thin film interface scheme including one or more thin film layers, typically up to 2 μm thick, followed by a thick (typically 20 μm or more) layer of either a soft low melting point metal for soldering or reflow bonding (U.S. Pat. No. 3,886,585 of Konantz et al -discussed below in detail) or a hard metal for thermocompression bonding (Harris U.S. Pat. No. 4,005,472). One patent (Harris U.S. Pat. No. 4,042,954, Aug. 16, 1977-discussed below) uses a thin film of aluminum/chromium as an additional conduction layer, 2 μm thick, below a bump of nickel and copper.

It appears that aluminum is not thought of in terms of a bulk material for contacts even though it is used throughout the industry as a thin film metal for contact to semiconductors, for wiring chips, and even, as in Harris U.S. Pat. No. 4,042,954 as an underlying thin film layer for hard bumps. Apparently the thought is that aluminum is unsuited to serve as a pedestal for thermocompression bonding. All of the prior art makes use of hard metals for thermocompression bonding pedestals, Harris U.S. Pat. No. 4,042,954 uses nickel and copper, Harris U.S. Pat. No. 4,005,472 uses copper, Meyer et al, "Metallurgy of Ti-W/Au/Cu system for TAB assembly" *J. Vac. Sci. Technol* A 3(3) pp 772-776 (May/Jun. 1985) and R. F. Unger, C. Burns, and J. Kanz "Bumped Tape Automated Bonding (BTAB) Applications" describe electroplated gold bumps. (Gold is normally rather hard in the plated condition.) Aluminum may be thought to be too soft for use as a bulk material. We have demonstrated that the softness of the aluminum makes possible good bonds while at the same time protecting the underlying structures from excessive force during bonding.

THE PROBLEM

Wet chemical processes or ion-beam etching present a risk of damage or corrosion to the wafers, as well as complexity of processing. The evaporation of gold bumps onto chips is an alternative process to electroplating, but this is likely to be prohibitively expensive in view of the inconvenience of reclamation of the gold which is not used.

In the past in the electronic chip packaging technology, there have been terminal pads which have been composed of aluminum metal. These have been used for direct wire bonding. Such thin aluminum pads have also been used with a thin layer of another metal adapted to soldering onto the pads. The terminal aluminum for these pads has a thickness of on the order of 1.5 μm. On the other hand there has developed a bumped chip technology in which bumps an order of magnitude thicker have been formed on the chips extending high enough so that the bumps can be joined to planar leads for packaging. TAB pedestals in the form of Tape Automated Bonding (TAB) bumps have been formed on the chips so that they can be joined to connectors automatically. The bumps are tall enough to provide sufficient clearance between the chip surface and the leads with such automatic bonding. The bumps have been joined to the packages by means such as thermocompression bonding rather than thermosonic wirebonding or soldering. The composition of the bumps has typically been primarily of hard metals such as copper, gold, or nickel or a combination of those metals.

The TAB pedestals or bumps on semiconductor chips have often been formed by electroplating of gold onto the chips. See Liu et al "A Review of Wafer Bumping for Tape Automated Bonding", *Solid State Technology* pages 71-75, (Mar. 1980). See also, Meyer et al, supra. A disadvantage of this is that the wet chemical processing can contaminate the chips. It involves many steps and is costly. Accordingly, it would be preferable to deposit the gold by a dry process. However, evaporation of gold bumps is a process which is too expensive to be employed as an alternative manufacturing process.

Copper, to become soft enough for low-stress bonding, requires high temperature annealing which would be harmful to chips. Also copper work hardens easily during bonding, thereby becoming unable to flow extensively at low bonding pressures. With copper, high pressure loads are required during bonding which could be harmful to the chips. Copper is a hard metal and it work hardens excessively.

U.S. Pat. No. 4,042,954 of Harris for a "Method for Forming Gang Bonding Bumps on Integrated Circuit Semiconductor Devices" issued Aug. 16, 1977, about nine years ago is an early bumped wafer patent which shows a bump 19 composed principally of copper layer 27 having a thickness of 0.7 to 1.5 mils (18-38 μm) formed on top of layer 22 of nickel about 0.1-0.4 mils (2.5-10 μm) thick. The bump adheres via transition layers 21 to an aluminum interconnect layer 18 on top of a semiconductor substrate 13. The transition layers 21 are a very thin set of layers of adhesion metals including Cr Al, Cr, and Au which are just a base for the thicker layers of Ni 22 and Cu 27 which actually form the bump. In particular, layer 24 is composed of Al or Cr as much as 20,000 Angstroms (2.0 μm) thick with a preponderance of aluminum therein but well below the bump 27. There is no suggestion that the bump would be composed of any metals other than copper and nickel.

U.S. Pat. No. 3,886,585 of Konantz et al for a "Solderable Multilayer Contact for Silicon Semiconductor" issued May 27, 1975, teaches a pad adapted for soldering of a terminal lead 28 with solder 20 to a pad composed of aluminum layer 12 and nickel manganese layer 16. Aluminum layer 12, which is a relatively thin layer of about 0.5 to 1.5 micrometers thick, is applied by sputtering. Such a thickness, 1.5 micrometers is the standard thickness of a bonding pad for soldering of a lead to a chip. The pad of aluminum is coated with a Ni-manganese layer 16 to provide a soldering base. It is pointed out that additional layers of pure Ni, silver or gold might be used over the Ni manganese layer to provide a solderable layer. A KOVAR terminal lead 18 is used instead of a TAB beam lead. The Konantz et al patent does not discuss bumped chip or TAB technologies as is manifest from the scale of the structures involved using pads instead of pedestals or bumps.

In accordance with this invention bumps are provided on the order of 10-25 μm thick or thicker composed principally of aluminum metal. For many years, the bumps have been composed of either copper or gold. Apparently, in the past it has been belief of those skilled in the art that only relatively hard metals such as nickel and copper, copper, or gold would be suitable for use in bumps to be bonded by thermocompression bonding.

All of the chip-bumping methods described (by Harris et al U.S. Pat. Nos. 4,005,472 and 4,042,954, as well as Meyer 1985, and Liu 1980, supra) form permanent chip to package bonds. Increasing use of TAB for multichip packaging and for the packaging of more costly high I/O (Input/Output) count chips suggests the need for reworkable chip-to-package connections.

We have found that the use of a thick tin layer at the top surface of our dry process metallurgy bump provides a solution to this problem.

In order to use Tape Automated Bonding (TAB) for packaging VLSI chips whether with bumped tape or bumped chips, the different metals of the tape and the chip I/O pads must be bonded to produce high-strength, low-resistance contacts between the metal on the tape and on the chip I/O pads. In general this requires the fabrication of interface structures. The interface used must be a good barrier to keep the bonding surface, usually gold, from diffusing into the Al/Cu chip I/O pad, must not react with the aluminum, must adhere well to the pad, and must be a good electrical conductor. In addition, for bumped tape use the barrier must help protect the underlying metallurgy from potential damage caused by the thermocompression bonding process.

The use of titanium nitride allows the fabrication of TAB interfaces with fewer metals. The use of fewer metals and fewer metal layers means simplified processing, and the use of fewer sources where multiple evaporations are required. A structure that is simplified through the use of titanium nitride is the aluminum bump used in bonding aluminum bumped chips to planar tape.

SUMMARY OF THE INVENTION

In the past it has been well known that aluminum is a good conductor material for the top surface metallurgy on a chip. The aluminum employed however has been in the form of films of about 1.5 μm in thickness which is far thinner than bumps which are usually 10-25 μm or even thicker. However, we have discovered in accordance with this invention that we can provide a new structure for pedestals for thermocompression bonding employing thick aluminum in the bumps of the pads.

We have discovered that the standard practice of use of copper or gold in the environment of TAB bumps and/or pedestals can be modified by the replacement of the copper and gold as the principal metal in the bumps with aluminum. There are several advantages to using aluminum. For example, with copper, higher pressure loads are required during bonding than are required with aluminum. Aluminum is softer than copper, and aluminum work hardens less than copper for the same amount of deformation during bonding. Thus, since aluminum does not work harden as much as copper, aluminum is a more desirable bump material.

While it is known that aluminum is a good conductor material for the top surface metallurgy on a chip, in pedestals for thermocompression bonding it is novel. Unexpectedly, the relative mechanical softness of aluminum as contrasted to gold or copper has proved to be beneficial because it permits good bonds to be made at the same time that the underlying chip structure is protected from transmission of excessive forces down to the silicon during bonding. Thus cracking of chips is reduced.

This invention relates to terminals on chips in the form of bumps adapted to bonding of a lead to connect the chip in an electronic system. The key to this invention is the deposition onto chips of aluminum bumps having thicknesses on the order of about 10-25 μm (100,000 to 250,000 Angstroms). These bumps are preferable to the plated bumps of hard metals taught in the prior art.

An ancillary feature of the invention is that the aluminum is bonded to the aluminum chip by means of an adhesion metal such as chromium or titanium. Use of such an adhesion metal is well known. Another layer of an adhesion metal can be deposited on top of the Al layer, followed by a diffusion barrier layer of a metal such as Cu or Ni followed by a layer of a noble metal such as gold to protect the bump from oxidation prior to bonding.

An optional extension of this structure is the evaporation of a thick layer of Sn instead of a noble metallic layer. The thick Sn layer is not completely consumed in bonding, and thus the remaining Sn layer makes the bump reworkable. This provides a joint which may be reflowed, thereby facilitating the rework process. This joint may be formed under very low stress bonding conditions.

Preferably, a first metallic layer is deposited upon the thick aluminum layer, preferably composed of thin titanium or chromium. A second metallic layer is deposited upon the titanium layer (preferably composed of Cu or Ni), and a third metallic layer composed of gold (0.5 micrometer thick), which is the "cover" metal exposed to the atmosphere and which is bonded to the TAB beam.

In summary, the structure includes a semiconductor chip with integrated circuits formed therein, with a plurality of electrical lead lines on the chip terminating in conductive terminal pads, preferably composed of aluminum. The chip is protected by a passivation layer over structures other than the bumps. A thin Cr or Ti adhesion layer joins the aluminum pads to the aluminum bumps. A thin adhesion layer of Cr or Ti joins the aluminum pads to the aluminum bumps. A thick layer of aluminum forms the bumps. The aluminum bump can be coated with a plurality of layers.

One can deposit the adhesion layer of Cr or Ti, then the Al bump, a layer of Cr or Ti, and then Cu with Au on top to protect the device from oxidation.

When Cu is evaporated onto Ti or Cr, a phased evaporation layer, about 0.10 micrometers thick (1000 Angstroms) is commonly desirable. This layer may be achieved simply by the co-evaporation of the metals. This is done because Cu does not form strong intermetallics with these two metals.

A key feature of this invention is the deposition onto chips of aluminum bumps having thicknesses on the order of at least 15 micrometers (150,000 Angstroms). These bumps are preferable to the plated bumps of hard metals taught in the prior art.

An ancillary feature of the invention is that the aluminum is bonded to the chip by means of an adhesion metal. Use of such an adhesion metal is well known. Another layer of an adhesion metal can be deposited on top of the Al, followed by a diffusion barrier layer of a metal such as Cu or Ni followed by a layer of a noble metal such as gold to protect the bump from oxidation prior to bonding.

Another extension of this structure is the evaporation of a layer of Sn instead of the layer of a noble metal. Bonding can be accomplished by forming tin/gold eutectic alloy at 280° C. The thick tin layer is not completely consumed in bonding and this makes the bump reworkable.

Titanium nitride can be substituted as a combined adhesion and barrier layer replacing the separate adhesion layer (Ti or Cr) and the barrier layer (Cu or Ni) on top of the thick aluminum with a single diffusion/adhesion layer of TiN. The TiN is followed a noble metal layer (gold, palladium or platinum.)

The foregoing and other objects, features and advantages of the invention will be apparent from the more particular description of the preferred embodiments of the invention which follows.

DESCRIPTION OF THE PREFERRED EMBODIMENT

Disclosure of the Invention,

Best Mode and Other Modes of Carrying Out the Invention

Figure 1:
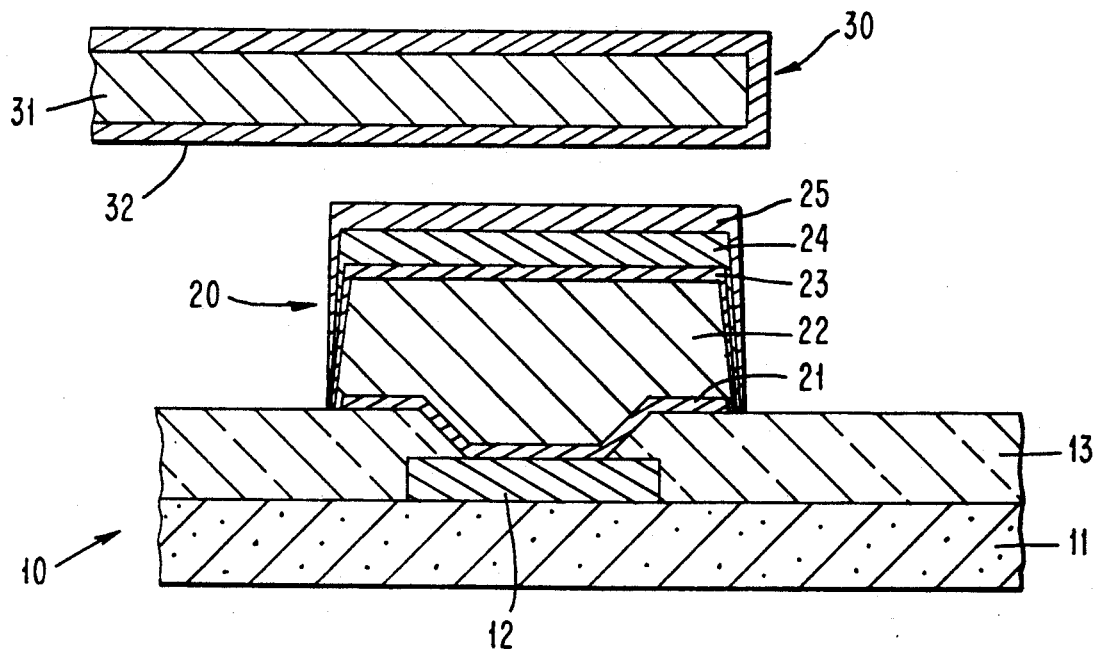
FIG. 1 shows a chip carrying an aluminum or Al-alloy body TAB bump designed in accordance with this invention, and a lead juxtaposed above the bump ready to be bonded to the bump.

FIG. 1 shows a chip 10 carrying a bump 20 designed in accordance with this invention, and a lead 30 ready to be bonded to the bump 20 by a process such as thermocompression bonding. Chip 10 includes a substrate 11, an aluminum conductor 12 protected by a passivation layer 13, composed of a material such as polyimide or silicon dioxide. A window is formed in the passivation layer onto which a titanium or chromium adhesion layer 21 is deposited through the window into contact with aluminum conductor 12, as the base of a bump 20. Aluminum body 22 which is 10-25 $\mu$m thick forms the bulk of bump 20. To increase the strength of aluminum body 22, aluminum body 22 can be composed of Al plus about 1 atomic percent to about 15 atomic percent copper in a preferred embodiment in accordance with this invention. Layer 22 is bonded to adhesion layer 21. On top of bump 22 are formed a first metallic layer 23 composed of titanium (or Cr), about 0.05–0.15 $\mu$m thick. The first metallic layer 23 provides a barrier between a second metallic layer 24 and the body 22 of aluminum. The second metallic layer 24 composed of copper (or nickel), which is about 1.1 $\mu$m thick, serves as a diffusion layer. The second metallic layer 24 provides a clean bonding surface. A third metallic layer 25 is composed of gold, and that third layer 25 is about 0.15–0.50 $\mu$m thick.

TAB beam lead 30 is shown ready to be bonded to the bump. Lead 30 preferably comprises copper body 31 coated with a thin film of metallurgy 32 preferably composed of gold or tin. However, it may be left uncoated or as bare Cu.

Figure 2:
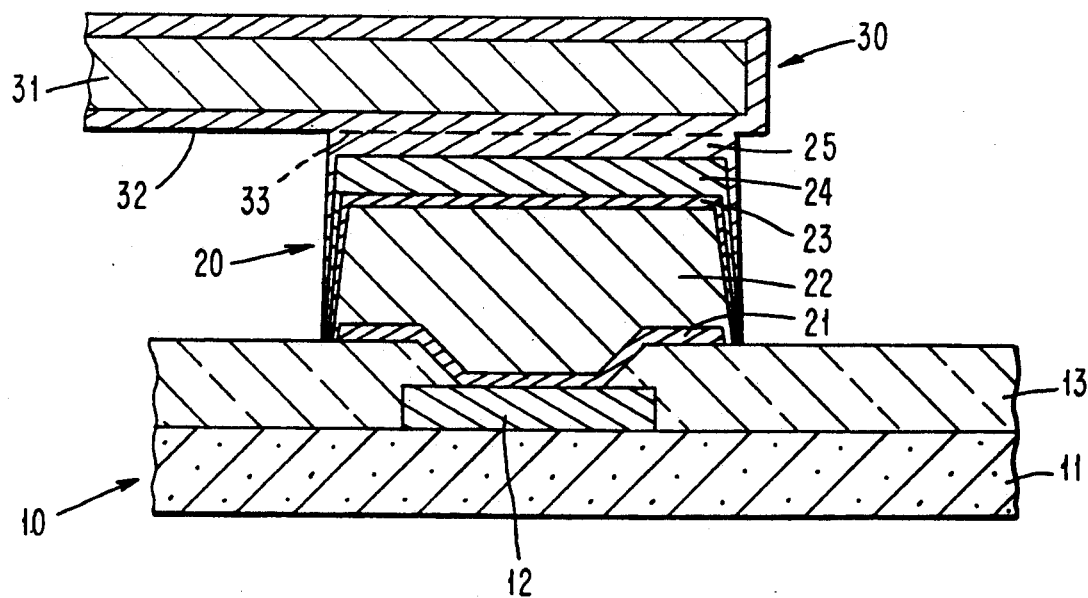
FIG. 2 shows the chip of FIG. 1 carrying the bump with the lead bonded to the bump by thermocompression bonding.

FIG. 2 shows the chip 10 of FIG. 1 carrying the bump 20 with lead 30 bonded to the bump 20 by a process such as thermocompression bonding, with the layers 25 and 32 joined together at interface 33 and bonded by the bonding process to form a unitary intermingled structure with the interface 33 between the layers 25 and 32 ceasing to exist as the two layers blend together during the bonding process.

It may be desirable to increase bump strength. One way to accomplish such strengthening is by adding alloying elements during co-evaporation of Al plus the alloying element such as Cu, Ni, Si, and Fe. Alternative alloying constituents are Ti, Cr, Mn, Co, Zn, Pt, Mg, Ca and Au. The amount of such alloying elements in both groups which can be added to the Al ranges from about 1 atomic percent to about 15 atomic percent.

TABLES I and II show various alternative combinations of the materials in the layers of the embodiments of FIGS. 1 and 2, plus preferred thicknesses of the layers.

TABLE I

| BEAM METALLURGY AND TYPE OF BOND | | | | |
|---|---|---|---|---|
| SURFACE | | THICKNESS | BUMP SURFACE | BOND TYPE |
| Au Plating on Cu | Au | 0.5-2.0 μm Au 25-35 μm Cu | Au | Au/Au |
| Sn Plating on Cu | Sn | 0.5 μm Sn 25-35 μm Cu | Au | Sn/Au |
| Bare Cu | Cu | 25-35 μm Cu | Au | Cu/Au |
| Au Plating on Cu | Au | 0.5-2.0 μm Au 25-35 μm Cu | Sn | Au/Sn |
| Sn Plating on Cu | Sn | 0.5 μm Sn 25-35 μm Cu | Sn | Sn/Sn |
| Bare Cu | Cu | 25-35 μm Cu | Sn | Cu/Sn |

TABLE II

| BUMP STRUCTURE (See FIG. 1) | | | |
|---|---|---|---|
| LAYER | THICKNESS | PREFERRED MATERIAL | OTHER MATERIALS |
| 25 | 0.15-0.5 μm | Au | Pd, or Pt |
| 24 | 0.8-1.2 μm | Cu | Ni, Co, Pt, or Pd |
| 23 | 0.05-0.15 μm | Ti | Cr |
| 22 | 15-25 μm | Al | Al-alloy |
| 21 | 0.05-0.15 μm | Ti | Cr |

ADDITIONAL EMBODIMENTS

Figure 3:
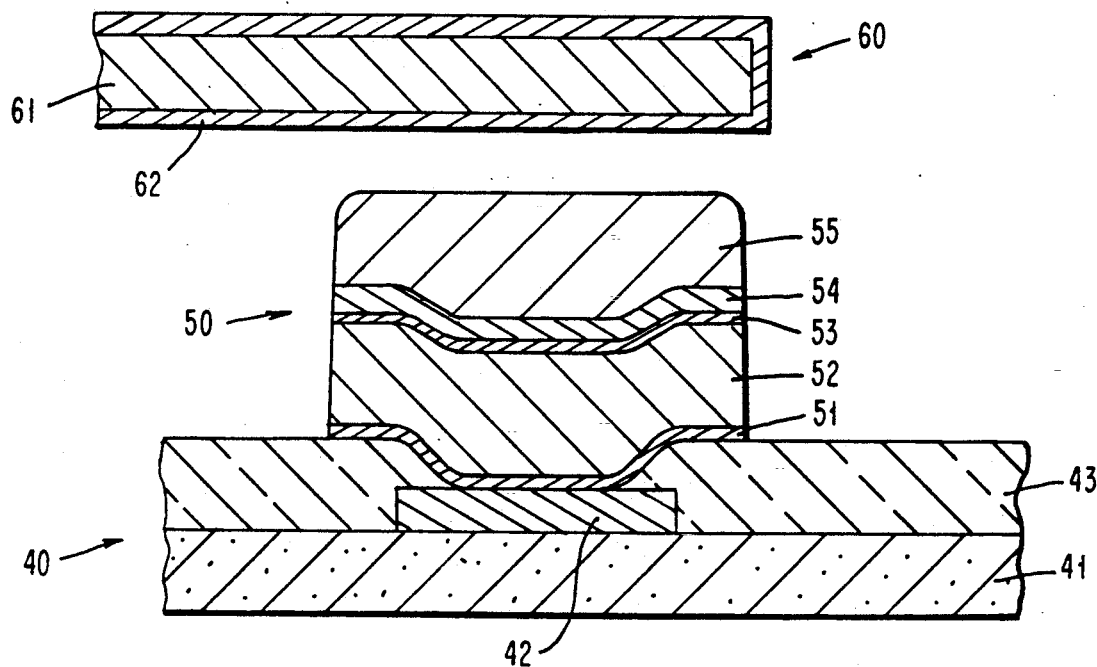
FIG. 3 shows a metallic bump structure in accordance with this invention formed on a chip with a reworkable upper surface on top of the bump and a lead to be bonded to the bump juxtaposed there-above.

FIG. 3 shows a metallic bump structure 50 which may be formed on a chip 40 by evaporation through a mask. The mask may be a standard etched metal mask composed of a metal such as molybdenum, or it may be composed of thick photoresist. The bulk 52 of the bump 50 is composed of soft aluminum evaporated to the desired height. A thin transition layer 51, 0.1 μm thick of titanium or chromium, is first evaporated between the aluminum-copper pad 42 and the aluminum bulk 52 of the bump 50. The transition layer 51 reduces contact resistance and insures adhesion. The bulk 52 of aluminum is 10 to 25 μm thick soft aluminum which is evaporated. Aluminum plus alloying elements could be employed as in FIG. 1 in layer 52, or in other embodiments layer 52 could be composed of copper, gold or nickel. The top of the soft aluminum layer 52 is covered with a thin layer 53 of titanium or chromium. An optional intermediate layer 54 of 1 μm of nickel or copper may then be evaporated. The structure is then capped with a thick 2 to 6 μm top layer 55 of a low-melting point metal selected from the group consisting of tin, lead, and indium (Sn, Pb and In), or combinations thereof.

TAB beam lead 60 is shown ready to be bonded to the bump. Lead 60 preferably comprises copper body 61 coated with a thin film of metallurgy 62 preferably composed of gold or tin. However, it may be left uncoated or as bare Cu.

Figure 4:
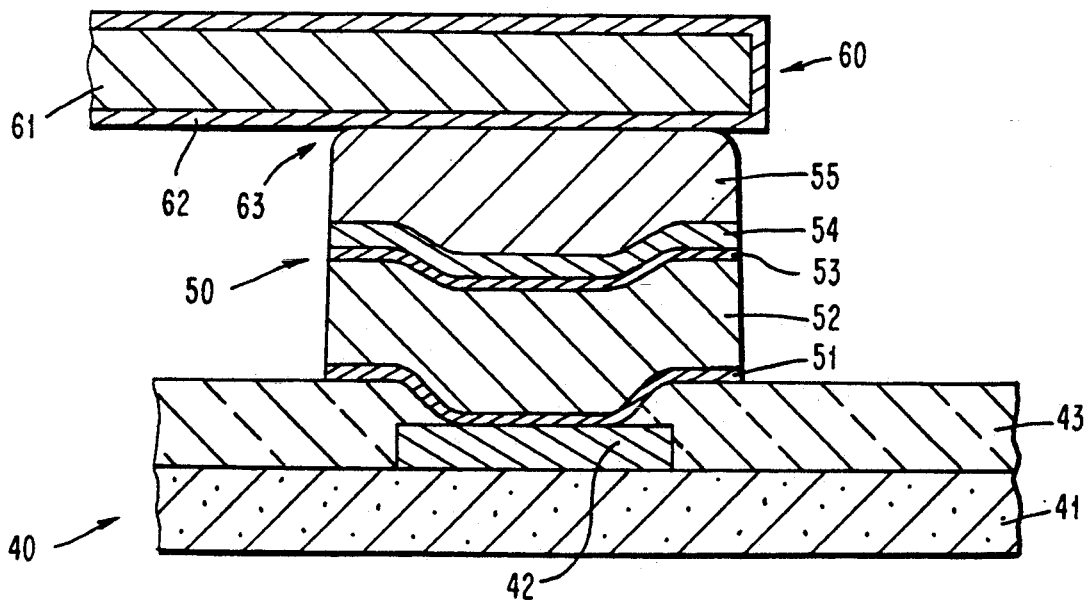
FIG. 4 shows the chip of FIG. 3 carrying the bump with the lead bonded to the bump by thermocompression bonding.

FIG. 4 shows the chip 40 carrying the bump 50 as in FIG. 2 with lead 60 bonded to the bump 50 by a process such as thermocompression bonding, with the layers 55 and 62 joined together at interface 62 and bonded by the bonding process to form a unitary intermingled structure with the interface 63 between the layers 55 and 62 ceasing to exist as the two layers blend together during the bonding process.

This structure satisfies all of the requirements for a reliable chip connector. Bonding may be accomplished by forming a tin/gold alloy, one of which is a tin/gold eutectic which melts at 280° C. The thick tin layer is not completely consumed in bonding and this makes the bump reworkable. Gold-plated decal or TAB leads may be bonded without the use of solder or flux. This solves a serious problem involved with decal packaging techniques. No cleaning of flux is required. A chip having this structure may also be attached to ceramic chip carriers, particularly those having a low coefficient of thermal expansion ($2-4 \times 10^{-6}/°C.$).

Chip connectors as described above have been fabricated using state of the art methods. The aluminum connectors were evaporated through metal masks. The bump height was chosen to be 20 μm, although bumps as high as 125 μm high may be evaporated through the same masks. Arrays of pads have been fabricated with several footprints.

Analysis shows good uniformity of the structure heights, good adhesion to the surface, low contact resistance (typically about 2 mohm) and good bonding characteristics. Typically pull strengths for bonding to TAB beams are 50 grams per lead, with the break usually occurring in the lead, which manifests the great strength of the bump structure made in accordance with this invention.

The reworkability of the structure has been demonstrated. SEM scans of a chip bonded to a gold-plated TAB lead have been made. The chip was bonded to the TAB leads using reworkable bumps. After rework, the tin remains on the pads on top of the bumps ready for the next bond. This has been studied with the aid of SEM photographs. We have observed that not all of the tin has been consumed. Re-bonding of the chips after removal has been accomplished successfully.

This structure and process have several advantages. The structure is reworkable in a dry process of bonding. The body is composed of a thick aluminum body and a thick tin bonding surface which are evaporated in a single pump-down of an evaporation chamber. In the embodiments of FIGS. 3 and 4 require no use of noble metals. The structure can be employed with TAB or low coefficient of expansion ceramic bonding. TABLE III shows various alternative combinations of the materials in the layers of the embodiments of FIGS. 3 and 4, plus preferred thicknesses of the layers.

TABLE III

| REWORKABLE BUMP STRUCTURE (See FIG. 3) | | | |
|---|---|---|---|
| LAYER | THICKNESS | PREFERRED MATERIAL | OTHER MATERIALS |
| 55 | 2-6 μm | Sn | Pb or In |
| 54 | .8-1.2 μm | Ni | Cu |
| 53 | 0.05-0.15 μm | Cr | Ti |
| 52 | 15-25 μm | Al | Ni, Cu, Au, Al-Alloy |
| 51 | 0.05-0.15 μm | Cr | Ti |

Figure 5:
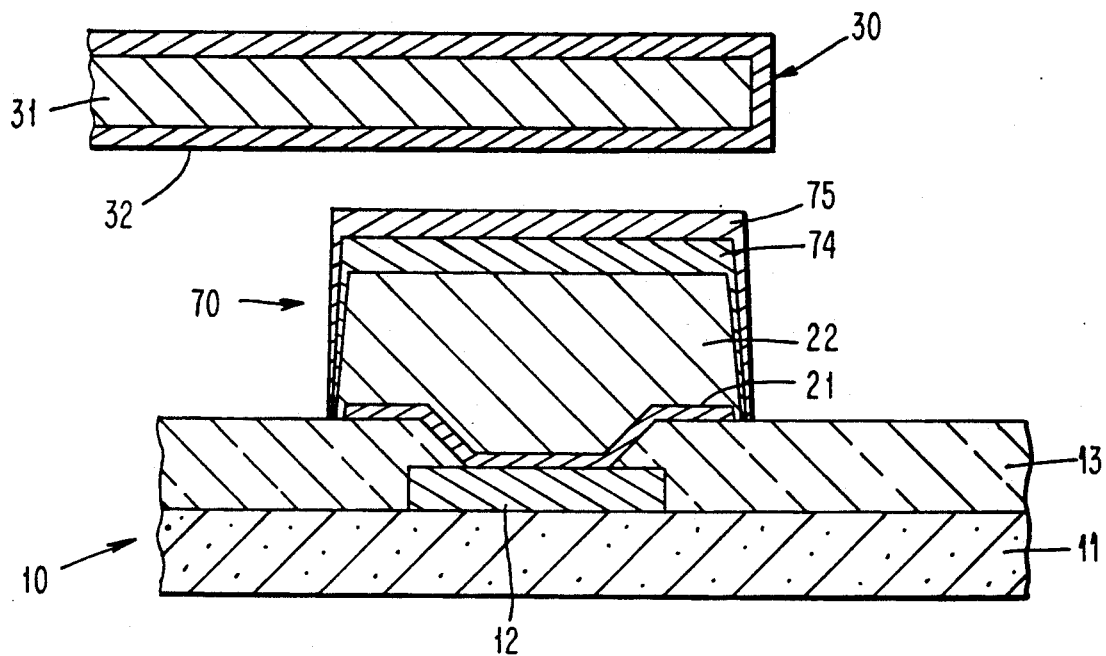
FIG. 5 is a drawing of a modification of FIG. 1 which shows a chip carrying an aluminum or Al-alloy body TAB bump designed in accordance with a variation of this invention, and a lead juxtaposed above the bump ready to be bonded to the bump.
Figure 6:
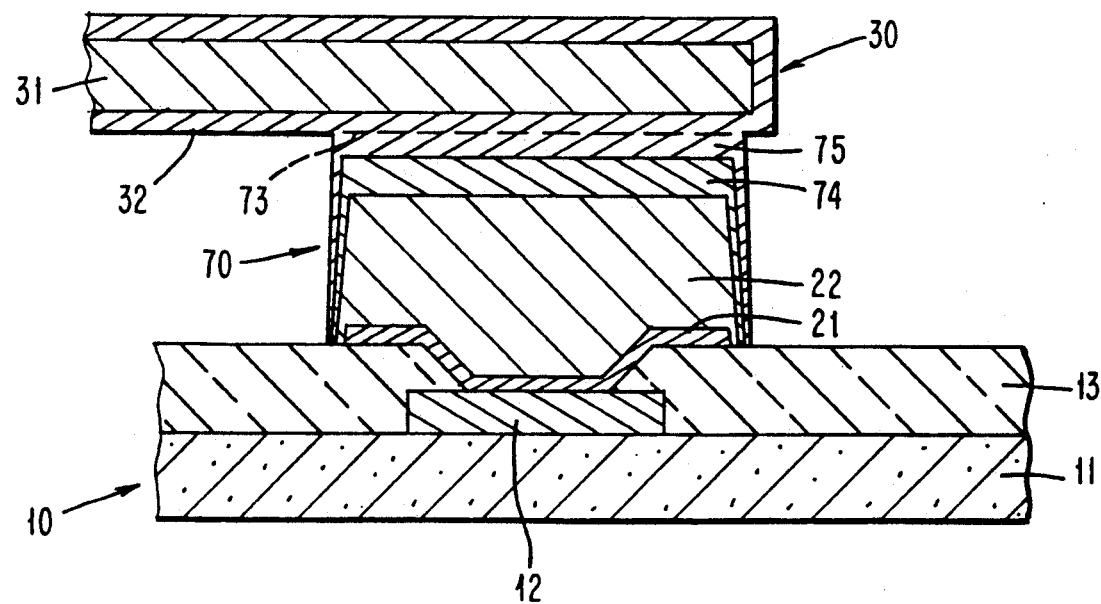
FIG. 6 shows the chip of FIG. 5 carrying the bump with the lead bonded to the bump by thermocompression bonding.

Referring to FIGS. 5 and 6, the structure of FIGS. 1 and 2 have been modified slightly by elimination of one of the layers for reasons described below. FIGS. 5 and 6 employ a new TAB tape-to-chip bonding interface structure. This structure uses a single material, titanium nitride for both adhesion and as a diffusion barrier, reducing the number of metal sources needed for evaporation.

In order to use Tape Automated Bonding (TAB) for packaging VLSI chips which have been bumped, the different metals of the tape and on the bumps must be bonded to produce high-strength low-resistance contacts between the metal on the tape and on the bumps. In general this requires the fabrication of interface structures. The interface used must be a good barrier to keep the bonding surface, usually gold, from diffusing into the underlying aluminum bump, must not react with the aluminum, must adhere well to the bump, and must be a good electrical conductor.

The use of titanium nitride allows the fabrication of TAB interfaces with fewer metals. The use of fewer metals and fewer metal layers means simplified processing, and the use of fewer sources where multiple evaporations are required. A structure that is simplified through the use of titanium nitride is the aluminum bump used in bonding aluminum bumped chips to planar tape.

FIG. 5 shows an aluminum bump pedestal 70 comprising four evaporated layers of four metals. In sequence, these are as follows:
 (i) a thin adhesion layer 21 of titanium,
 (ii) a thick layer of aluminum 22,
 (iii) a thin layer of titanium nitride 74 that serves for both adhesion and as a barrier layer, and
 (iv) a bonding layer of gold 75.

This structure can be deposited with fewer steps than required to produce the five evaporated layers of four metals as shown in FIG. 1. The four evaporated layers of FIG. 5 require only three metal evaporation sources. In summary, the bump 70 shown in FIG. 5 consists of a thin layer of titanium 21, followed by a thick layer of aluminum 22, a layer of titanium nitride 74 that serves for both adhesion and as a barrier layer, and a bonding layer of gold 75.

Titanium nitride is extremely hard, measuring 2000 Kg/mm$^2$ on the Knoop hardness scale. This is greater than the hardness of tungsten carbide. It has an electrical resistivity of 21.7 $\mu$ohm-cm. A 0.2 $\mu$m thick TiN interface for a 100 $\mu$m square pad will have a series resistance of 4.4 $\mu$ohm. TiN adheres well to both aluminum and gold while preventing the diffusion of the gold into the aluminum.

FIG. 6 shows the pedestal 70 of FIG. 5 bonded to the beam 30, in much the same way as in FIG. 2.

As another alternative embodiment of this invention requires fewer layers of metal on the top surface as in FIG. 5, but is more closely related to the concept of FIG. 1, with the number of layers of FIG. 5, the layer 21 of FIG. 5 can be Cr or Ti, layer 22 can be Al, or Al-alloy layer 74 is Cu or Ni and the top layer is Au. TABLE V indicates the thicknesses of the various layers.

TABLES IV and V show various alternative combinations of the materials in the layers of the embodiments of FIGS. 5 and 6, plus preferred thicknesses of the layers.

TABLE IV

TITANIUM NITRIDE BUMP STRUCTURE (See FIG. 5)

| LAYER | THICKNESS | PREFERRED MATERIAL | OTHER MATERIALS |
|---|---|---|---|
| 75 | 0.15–0.5 $\mu$m | Au | Pd or Pt |
| 74 | 0.1–0.3 $\mu$m | TiN | |
| 22 | 10–25 $\mu$m | Al | Al-alloy, Cu, Ni |
| 21 | 0.05–0.15 $\mu$m | Ti | |

TABLE V

VARIATION OF ALUMINUM BUMP STRUCTURE (See FIG. 5)

| LAYER | THICKNESS | PREFERRED MATERIAL |
|---|---|---|
| 75 | 0.15–0.5 $\mu$m | Au, Pd, or Pt |
| 74 | 0.8–1.2 $\mu$m | Cu or Ni |
| 22 | 15–25 $\mu$m | Al, Al-alloy |
| 21 | 0.05–0.15 $\mu$m | Cr or Ti |

INDUSTRIAL APPLICABILITY

This invention is applicable in data processing such as personal computers, minicomputers, large scale computers and other data processing equipment. In addition, this system and process will be applicable to industrial and consumer electronic devices employing LSI chips. Electronic products such as transportation and control systems incorporating data processing systems for continuous monitoring and like functions can use the packaging methods and systems of this invention.

The engineering advantages of this design are the reliability of interconnections, and the ease of fabrication. Moreover, this design involves the use of a dry process eliminating the industry standard of use of wet chemicals, with attendant problems. It also eliminates lithography steps which enhances yield and reduces costs.

As stated above, this invention is particularly adapted to use in Tape Automated Bonding (TAB) joining of Very Large Scale Integration (VLSI) chips to substrates for packaging of the chips. TAB can be practiced automatically and reduce the labor intensiveness of packaging. Bumps in accordance with this invention serve to facilitate the process of practicing TAB packaging.

What is claimed is:

1. A structure comprising:
 a substrate;
 a bump on said substrate;
 the predominant component of the thickness of said bump being formed from a soft conducting layer formed from a material selected from the group consisting of aluminum and aluminum alloys;
 said bump having a surface layer suitable for bonding to a conductive lead;
 said lead being bonded to said surface layer by applying pressure to press said lead into said surface layer, said surface layer being sufficiently thin to permit said lead to be pressed into said soft conducting layer, said soft conducting layer being sufficiently thick and soft to permit said bump to deform as a result of said pressure to substantially prevent degradation of the portion of said substrate below said bump;
 said bump, where said lead is bonded thereto, projects vertically beyond the surface of any surrounding material in the region where said lead is bonded to said bump and said lead extends in cantilevered fashion away from said bump when said lead is bonded to said bump; and
 said surface layer is formed from a layer of titanium nitride disposed directly on said soft conducting layer, and a bonding layer disposed directly on said titanium nitride layer, said bonding layer being selected from the group consisting of gold, platinum and palladium.

2. The structure of claim 1 wherein said surface layer is formed from an adhesion layer disposed on said soft conducting layer, a barrier layer disposed on said adhesion layer and a bonding layer disposed on said barrier layer.

3. The structure of claim 1, wherein
said adhesion layer is a material selected from the group consisting of titanium and chromium;
said barrier layer is a material selected from the group consisting of copper, nickel, platinum, palladium and cobalt, and
said bonding layer is a material selected from the group consisting of gold, palladium, and platinum.

4. The structure of claim 2, wherein
said adhesion layer is a material selected from the group consisting of titanium and chromium,
said barrier layer is a material selected from the group consisting of nickel and copper,
said bonding layer is a material selected from the group consisting of Sn, Pb and In, and combinations thereof.

5. The structure of claim 1, wherein said surface layer is formed from a barrier layer disposed on said soft conducting layer, said barrier layer being a material selected from the group consisting of Cu and Ni, and a bonding layer disposed on said barrier layer, said bonding layer being a material selected from the group consisting of gold, platinum and palladium.

6. The structure of claim 1, wherein a cap of a reworkable bonding metal forms the top surface of said surface layer.

7. The structure of claim 5, wherein said
cap of a reworkable bonding metal is a material selected from the group consisting of tin, lead and indium, and combinations thereof.

8. The structure of claim 1, wherein said titanium nitride layer is disposed directly on said soft conducting layer, and a bonding layer disposed on said titanium nitride layer, said bonding layer being selected from the group consisting of gold, platinum and palladium.

9. The structure of claim 1, further including a conductor at the surface of said substrate, there being a passivation layer overlying said conductor, there being an opening in said passivation layer beneath said bump exposing a portion of said conductor, there being an adhesion layer between said soft conducting layer of said bump and said exposed portion of said conductor, said adhesion layer being selected from the group consisting of titanium and chromium.

10. The structure of claim 1 further including an intermediate layer between said bump and said substrate, said intermediate layer having a thickness which is less than about 0.15 microns.

11. The structure of claim 1, wherein said surface layer has a thickness which is from about 0.25 microns to about 7.35 microns.

12. The structure of claim 1, wherein said surface layer has a thickness from about 0.25 microns to about 7.35 microns and further including an intermediate layer between said bump and said substrate, said intermediate layer having a thickness which is from about 0.05 microns to about 0.15 microns.

13. The structure of claim 10, wherein said soft conducting layer has a thickness of from about 10 $\mu$m to about 25 $\mu$m.

14. The structure of claim 11 wherein said soft conducting layer has a thickness of from about 10 $\mu$m to about 25 $\mu$m.

15. The structure of claim 1, wherein said soft conducting layer has a thickness of from about 10 $\mu$m to about 25 $\mu$m.

* * * * *